United States Patent [19]
DeBrosse

[11] Patent Number: 5,614,431
[45] Date of Patent: Mar. 25, 1997

[54] METHOD OF MAKING BURIED STRAP TRENCH CELL YIELDING AN EXTENDED TRANSISTOR

[75] Inventor: John K. DeBrosse, Chittenden County, Vt.

[73] Assignee: International Business Machines Corporation, Hopewell Junction, N.Y.

[21] Appl. No.: 575,311

[22] Filed: Dec. 20, 1995

[51] Int. Cl.$^6$ ............................................. H01L 21/8242
[52] U.S. Cl. ........................... 437/52; 437/60; 437/919; 257/301; 257/303
[58] Field of Search .............................. 437/52, 60, 919; 257/301, 303

[56] References Cited

U.S. PATENT DOCUMENTS

| | | | |
|---|---|---|---|
| 3,619,804 | 11/1971 | Mears ............................................. | 331/8 |
| 4,310,805 | 1/1982 | Hackert et al. ............................... | 331/1 |
| 4,536,718 | 8/1985 | Underhill ...................................... | 331/16 |
| 4,646,118 | 2/1987 | Takemae . | |
| 4,860,070 | 8/1989 | Arimoto et al. . | |
| 4,894,696 | 1/1990 | Takeda et al. . | |
| 4,912,535 | 3/1990 | Okumura . | |
| 4,985,368 | 1/1991 | Ishii et al. .................................... | 437/38 |
| 5,049,518 | 9/1991 | Fuse et al. .................................... | 437/52 |
| 5,292,678 | 3/1994 | Dhong et al. ................................ | 437/50 |
| 5,336,629 | 8/1994 | Dhong et al. ................................ | 437/52 |
| 5,360,758 | 11/1994 | Bronner et al. .............................. | 437/52 |
| 5,364,812 | 11/1994 | Yashiro et al. ............................... | 437/52 |
| 5,378,907 | 1/1995 | Melzner ........................................ | 257/301 |
| 5,386,131 | 1/1995 | Sato .............................................. | 257/301 |
| 5,389,559 | 2/1995 | Hsieh et al. .................................. | 437/52 |
| 5,406,590 | 4/1995 | Miller et al. ................................. | 375/376 |
| 5,521,115 | 5/1996 | Park et al. .................................... | 437/60 |

*Primary Examiner*—John Niebling
*Assistant Examiner*—Richard A. Booth
*Attorney, Agent, or Firm*—Whitham, Curtis, Whitham & McGinn

[57] ABSTRACT

A process sequence, cell structure, and cell layout for an eight square folded bit line dynamic random access memory (DRAM) cell allows a transfer device channel length of two lithographic features. The process sequence may allow elimination of deep trench collar or cap deposition, or reduction of word line to word line capacitance. The cell prepared by the method allows a two lithographic feature transfer device channel length in an eight square folded bit line DRAM cell. The method uses conventional processing techniques with no spacer defined features and uses conventional structures. The cell requires only one additional mask (GPC) and minimal additional processing. The process sequence starts with deep trench (DT) processing, followed by deposition of SiO$_2$, planarization and pad strip. Then gate SiO$_2$, polysilicon, and pad are deposited. The structure is etched using a shallow trench isolation mask and filled with SiO$_2$. After planarization, a thin insulator is deposited and the structure is etched again with a Gate Poly Contact mask. A gate conductor is then deposited. After a final etch, wiring is added.

4 Claims, 12 Drawing Sheets

METHOD OF MAKING BURIED STRAP TRENCH CELL YIELDING AN EXTENDED TRANSISTOR

BACKGROUND OF THE INVENTION

1. Field of the Invention

The present invention generally relates to integrated circuit dynamic random access memories (DRAMs) and, more particularly, to a process sequence, cell structure and cell layout that achieves a reduction of DRAM cell size.

2. Background Description

Manufacturing of semiconductor devices is dependent upon the accurate replication of computer aided design (CAD) generated patterns onto the surface of a device substrate. The replication process is typically performed using optical lithography followed by a variety of subtractive (etch), additive (deposition) and material modification (e.g., oxidations, ion implants, etc.) processes. Optical lithography patterning involves the illumination of a metallic coated quartz plate known as a photomask which contains a magnified image of the computer generated pattern etched into the metallic layer. This illuminated image is reduced in size and patterned into a photosensitive film on the device substrate.

To achieve the required density, 1 Gbit-era DRAMs will require a cell with an area of approximately eight times the lithographic feature size squared. Conventional "8square" folded bit line DRAM cells require a transfer device channel length of one lithographic feature. However, it appears unlikely that the transfer device channel length will scale to one lithographic feature (approximately 0.18μm) in this time frame.

SUMMARY OF THE INVENTION

It is therefore an object of the present invention to provide a process sequence, cell structure, and cell layout for an eight square folded bit line DRAM cell allowing a transfer device channel length of two lithographic features.

It is also an object to provide a process sequence which may allow elimination of deep trench collar or cap deposition, or reduction of word line to word line capacitance.

According to the invention, there is provided a process sequence, cell structure, and cell layout, for an eight square folded bit line DRAM cell allowing a transfer device channel length of two lithographic features. The cell prepared by the method of this invention allows a two lithographic feature transfer device channel length in an eight square folded bit line DRAM cell. The method uses conventional processing techniques with no spacer defined features and uses conventional structures. The cell requires only one additional mask (a gate poly contact (GPC) mask) and minimal additional processing.

The process sequence starts with deep trench (DT) processing, followed by deposition of $SiO_2$, planarization and deposition of a pad strip. Then gate $SiO_2$, polysilicon, and pad are deposited. The structure is etched using a shallow trench isolation mask and filled with $SiO_2$. After planarization, a thin insulator is deposited and the structure is etched again with a Gate Poly Contact mask. A gate conductor is then deposited. After a final etch, wiring is added.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The following is an outline of the process sequence. Certain steps which are not significant to the invention, such as implant masks, have been omitted and may be inserted as appropriate.

Figure 1:
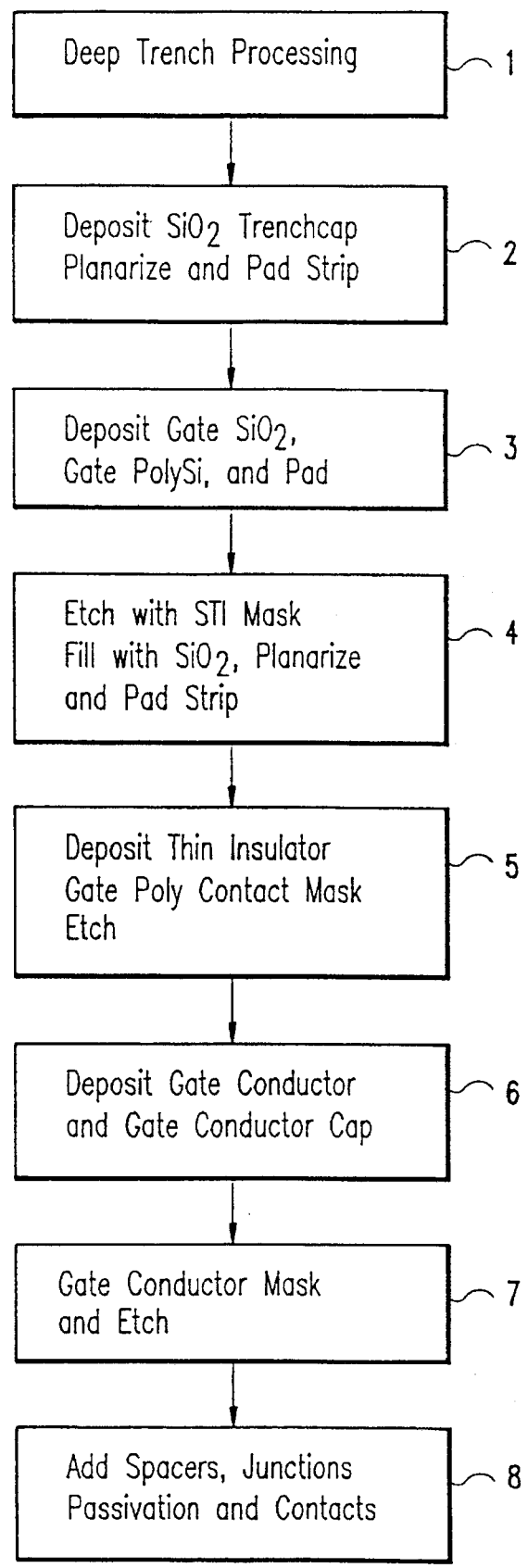
FIG. 1 is a flow chart showing the steps of the invention.

Referring now to the drawings, and more particularly to FIG. 1, there is shown a flow chart showing the steps of the invention. First in block 1, the cell is subject to deep trench (DT) processing. This is accomplished by forming N and P wells followed by depositing a protective nitride as a polish stop. A trench capacitor is formed by etching a deep trench into the substrate and forming an insulator along the trench surface. The trench is filled with doped polysilicon. The polysilicon is recessed to a first level and an insulating collar is deposited and etched. A second layer of conductive polysilicon is deposited over the first level and recessed. For the recess, the polysilicon is etched back below the surface to allow formation of the strap.

Figure 2:
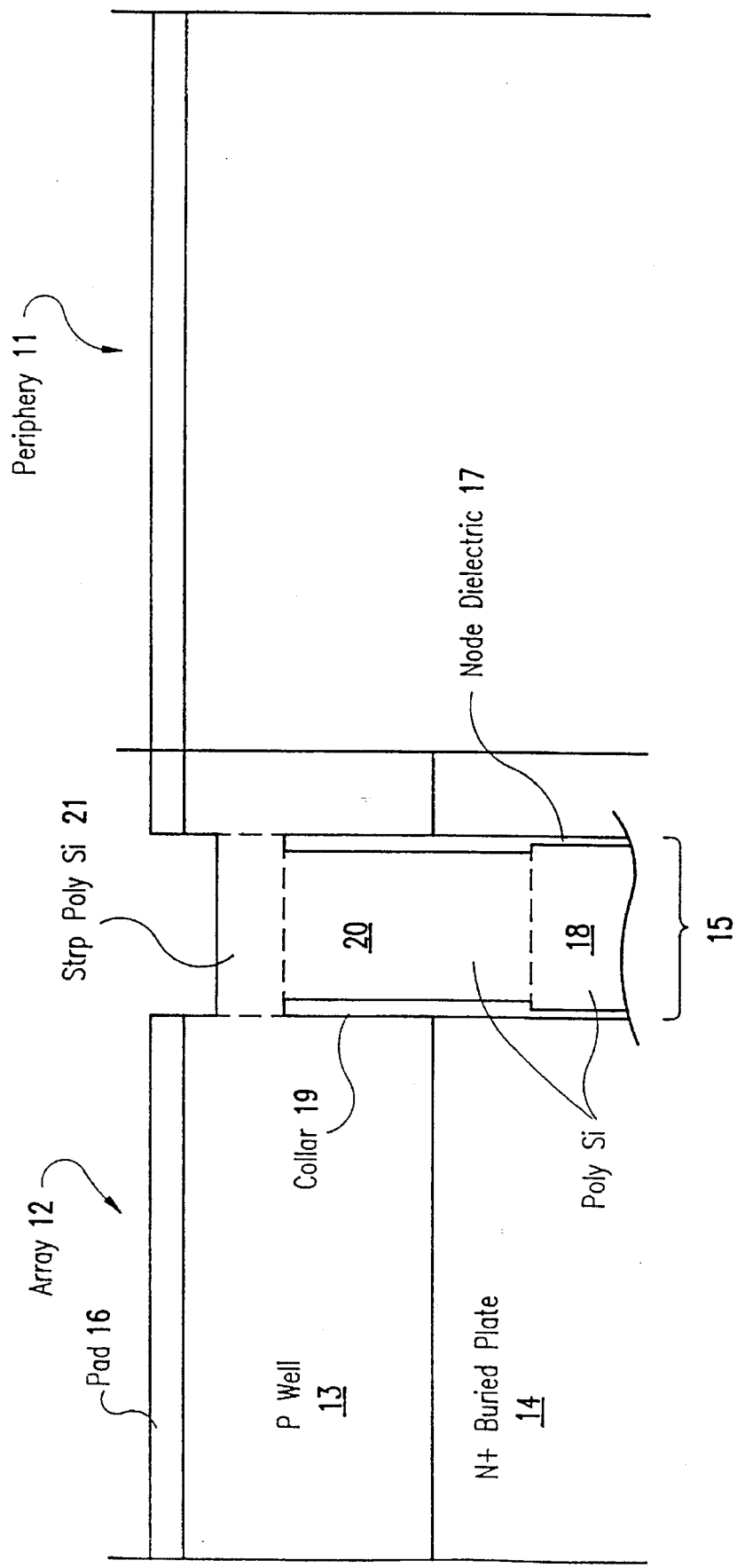
FIG. 2 is a cross section of a cell structure after deep trench processing.

The structure after this first step is shown in FIG. 2. In FIG. 2, one can see a cross-section of a cell following deep trench processing. There is shown both periphery 11 and array 12 regions. In the array region 12, a P well 13 and N+ buried plate 14 surround a trench 15. A pad 16 is deposited over the P well 13. Within the trench 15, there is deposited node dielectric 17 and polysilicon fill 18. The collar 19 and a second polysilicon fill 20 fills the next region of the trench 15. Strap polysilicon 21 has been deposited in the top layer of the trench 15.

Figure 3:
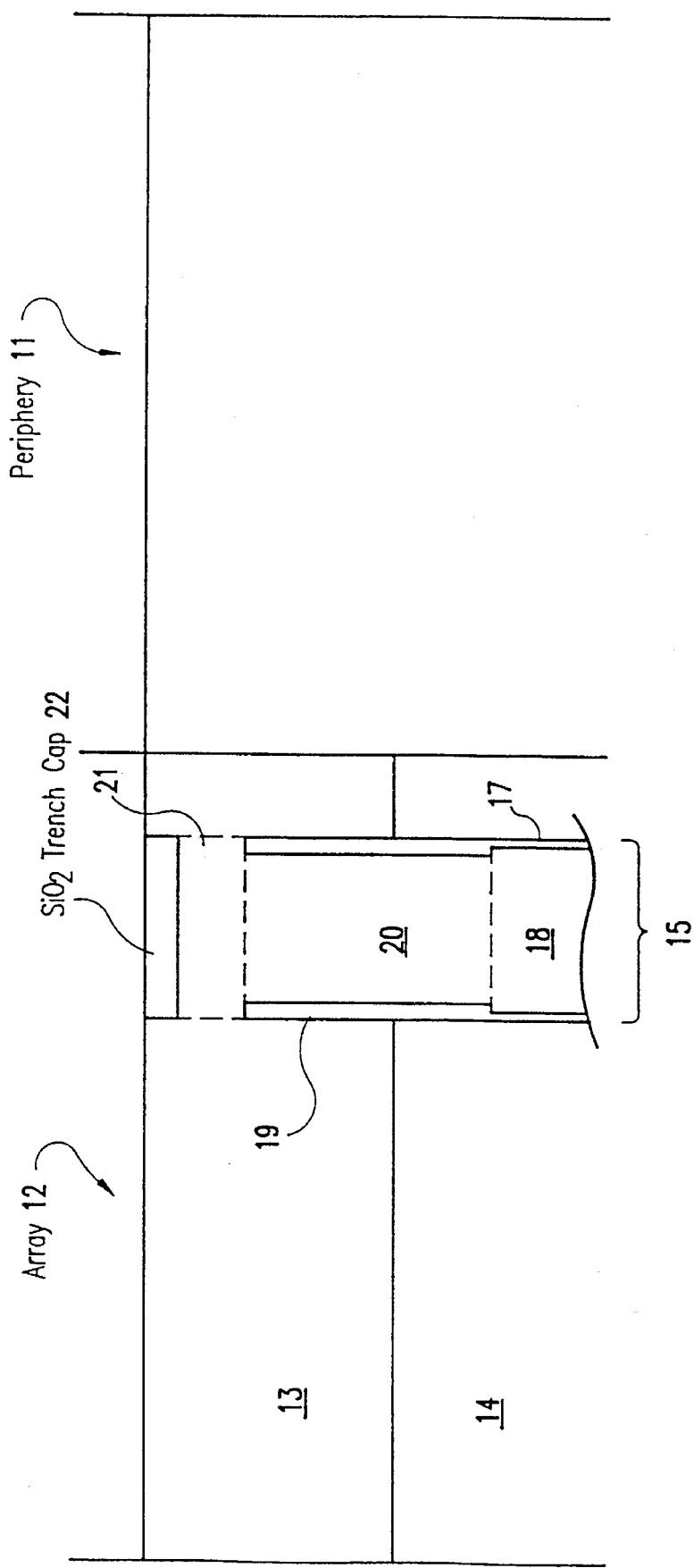
FIG. 3 is a cross section of a cell structure after $SiO_2$ trench cap deposition, planarization, and pad strip.
Figure 4:
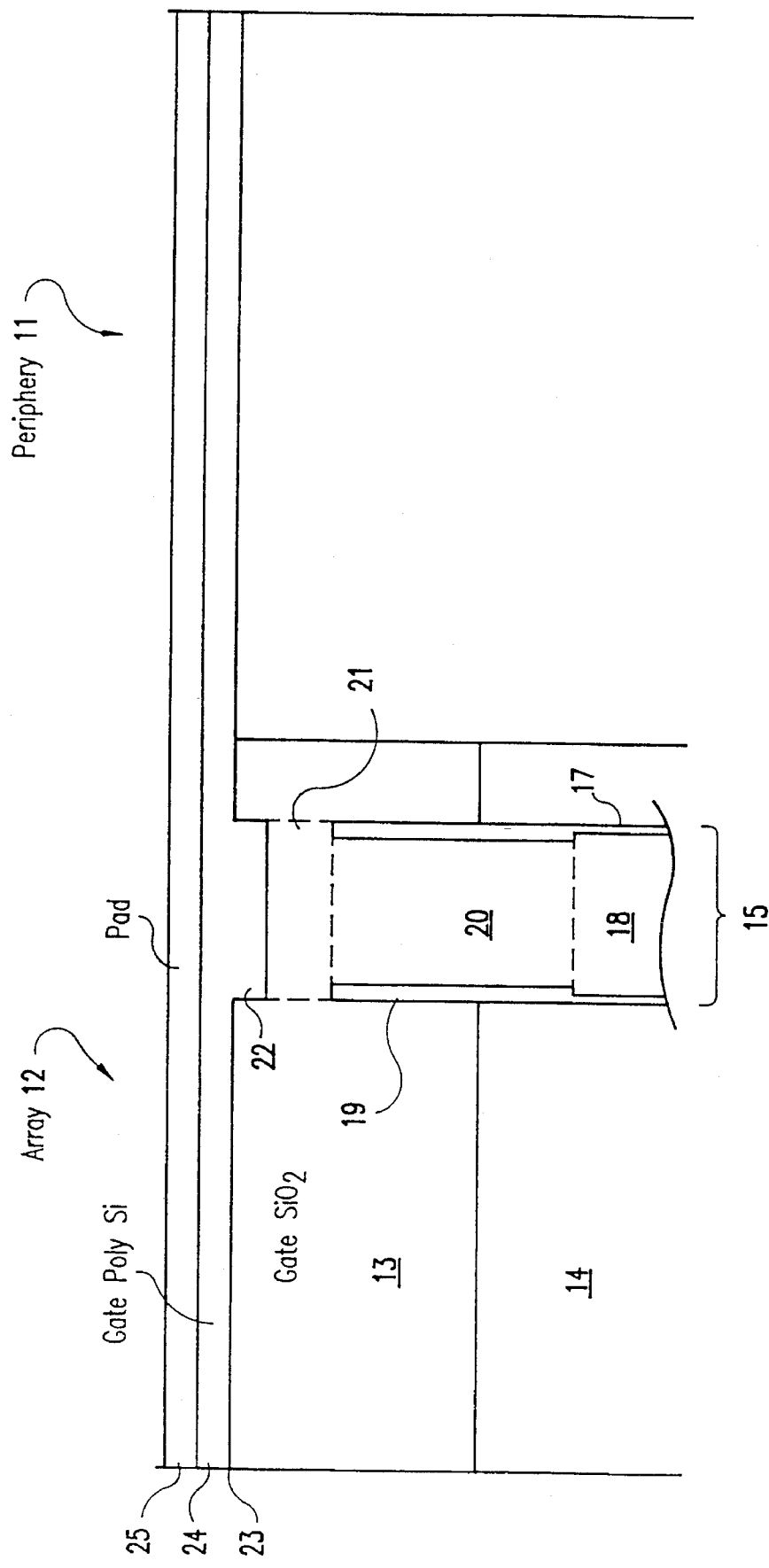
FIG. 4 is a cross section of a cell structure after gate $SiO_2$, gate polysilicon, and pad depositions.

Returning to FIG. 1, next, as shown in block 2, $SiO_2$ trench cap deposition, planarization, and pad strip occurs. The structure after this step is shown in FIG. 3. In FIG. 3, a $SiO_2$ trench cap 22 has been deposited in the trench 15 over the polysilicon 21. After the deposition of trench cap 22, the trench cap 22 is planarized and the pad 16 is removed. In the third step shown in block 3 of FIG. 1, gate SiO$_2$, gate poly silicon, and pad are deposited. In FIG. 4, gate SiO$_2$ 23 and gate polysilicon 24 have been deposited. A new pad 25 covers the entire structure.

Figure 5:
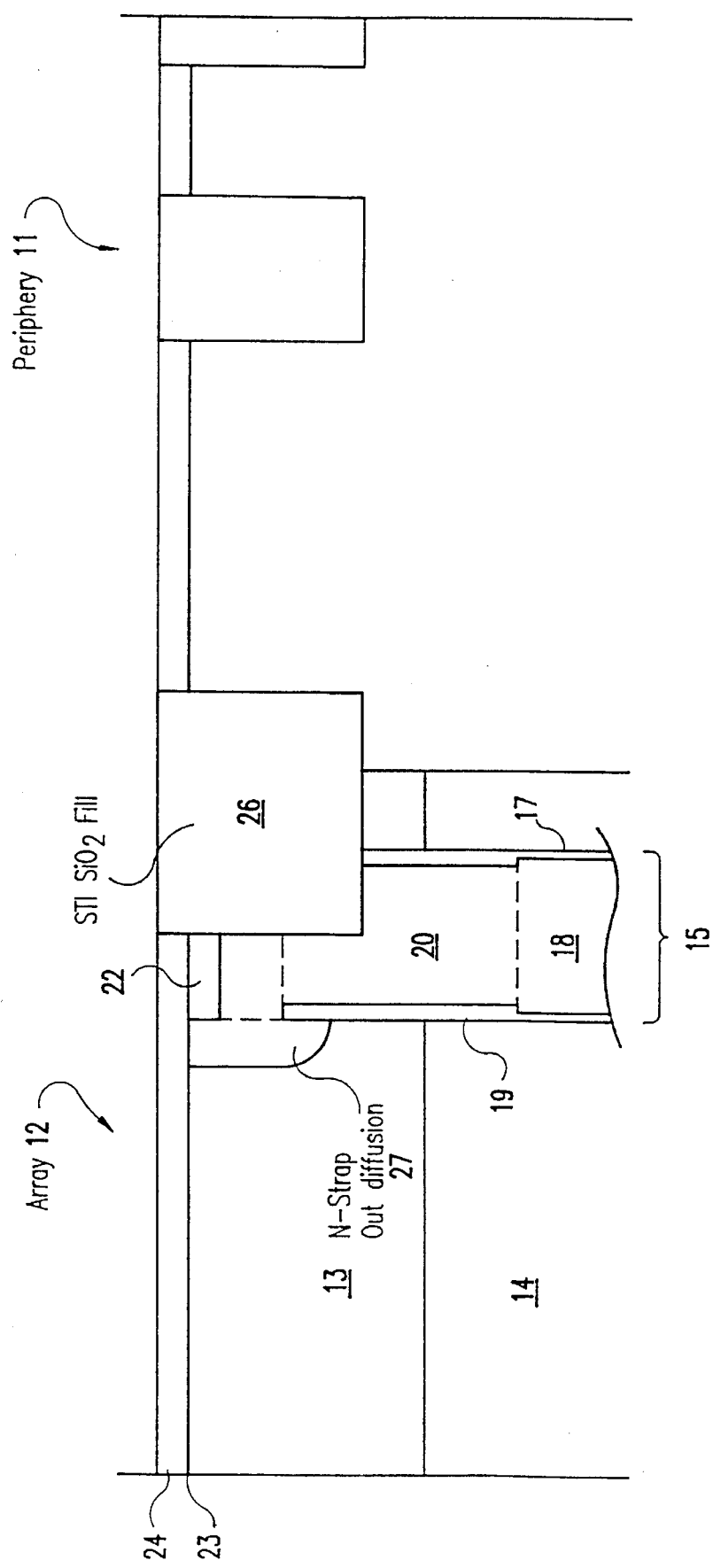
FIG. 5 is a cross section of a cell structure after shallow trench isolation etch, planarization, and pad strip.

In the fourth step shown in block 4 of FIG. 1, is to etch with a shallow trench isolation (STI) mask, fill with SiO$_2$, planarize, and add a pad strip. The fourth step is illustrated in FIG. 5. Here an STI mask has been used in etching the structure. Following the etch, STI SiO$_2$ fill 26 is deposited and planarized. The pad 25 has been removed. Thermal processing following the deposition of the strap polysilicon 21 causes dopant to diffuse out of the trench to form the N strap out diffusion 27. This diffusion will serve as the node diffusion of the DRAM cell.

Figure 6:
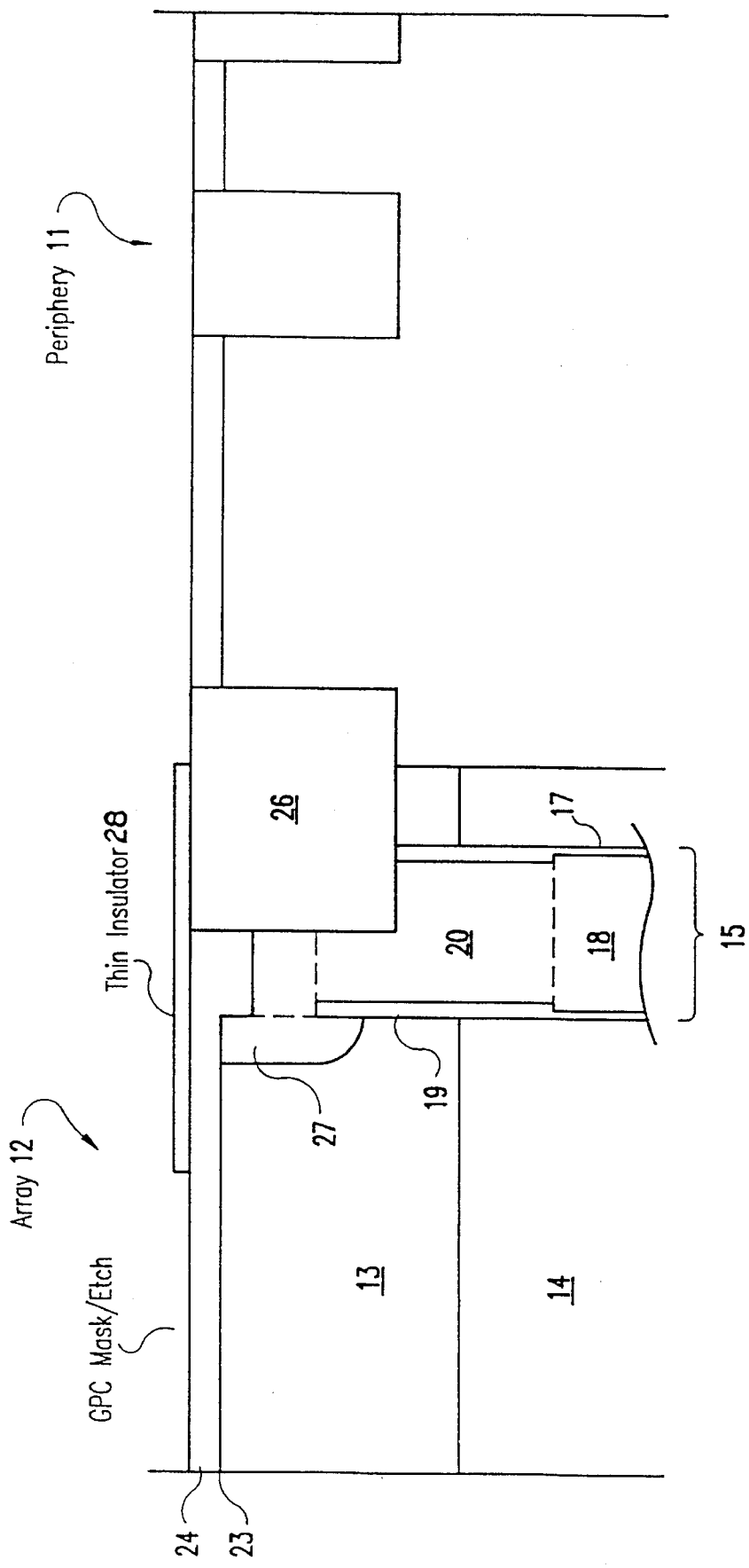
FIG. 6 is a cross section of a cell structure after thin insulator deposition and gate polysilicon contact (GPC) mask and etch.

In the fifth step shown in block 5 of FIG. 1, thin insulator (30 nm SiO$_2$) is deposited, and etched with a gate poly contact (GPC) mask. In FIG. 6, a thin insulator 28 has been deposited. The GPC mask is designed so as to remove the thin insulator 28 completely from the peripheral regions, allowing the formation of standard CMOS structures. In the array, the GPC mask is designed so as to remove the thin insulator 28 from a square region measuring approximately two lithographic features per edge and centered over what will become the bit line contact.

Figure 7:
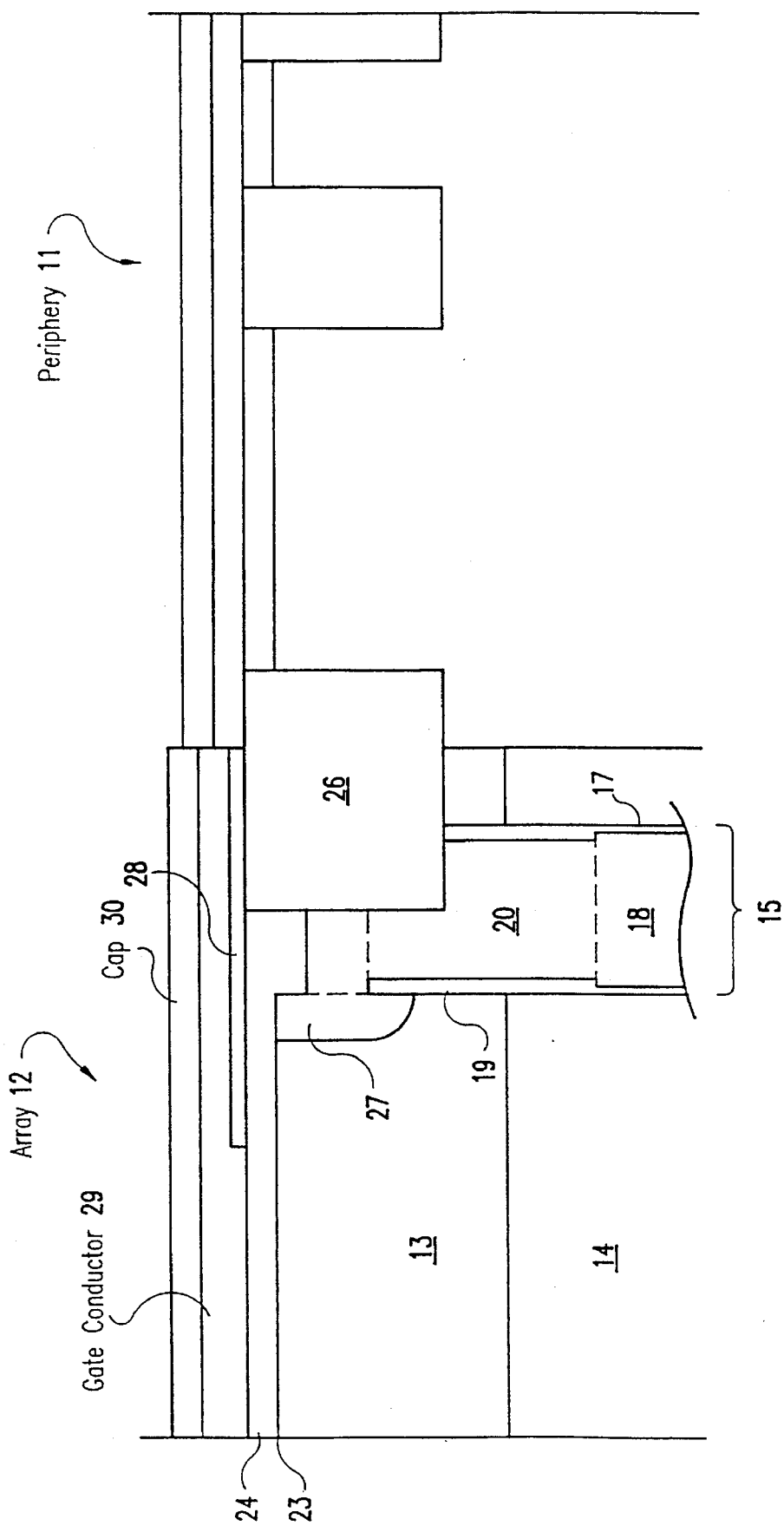
FIG. 7 is a cross section of a cell structure after gate conductor and gate cap depositions.

In the sixth step shown in block 6 of FIG. 1, the gate conductor (GC, polysilicon, or WSi$_x$) and the GC cap (Si$_3$N$_4$) are deposited. The sixth step is illustrated in FIG. 7. Gate conductor 29 and gate conductor cap 30 have been deposited. The surface of the array is now higher than that of the peripheral region by roughly the thickness of thin insulator 28 (30 nm). This thickness is chosen to be thin enough so as not to cause difficulties in subsequent processing.

Figure 8:
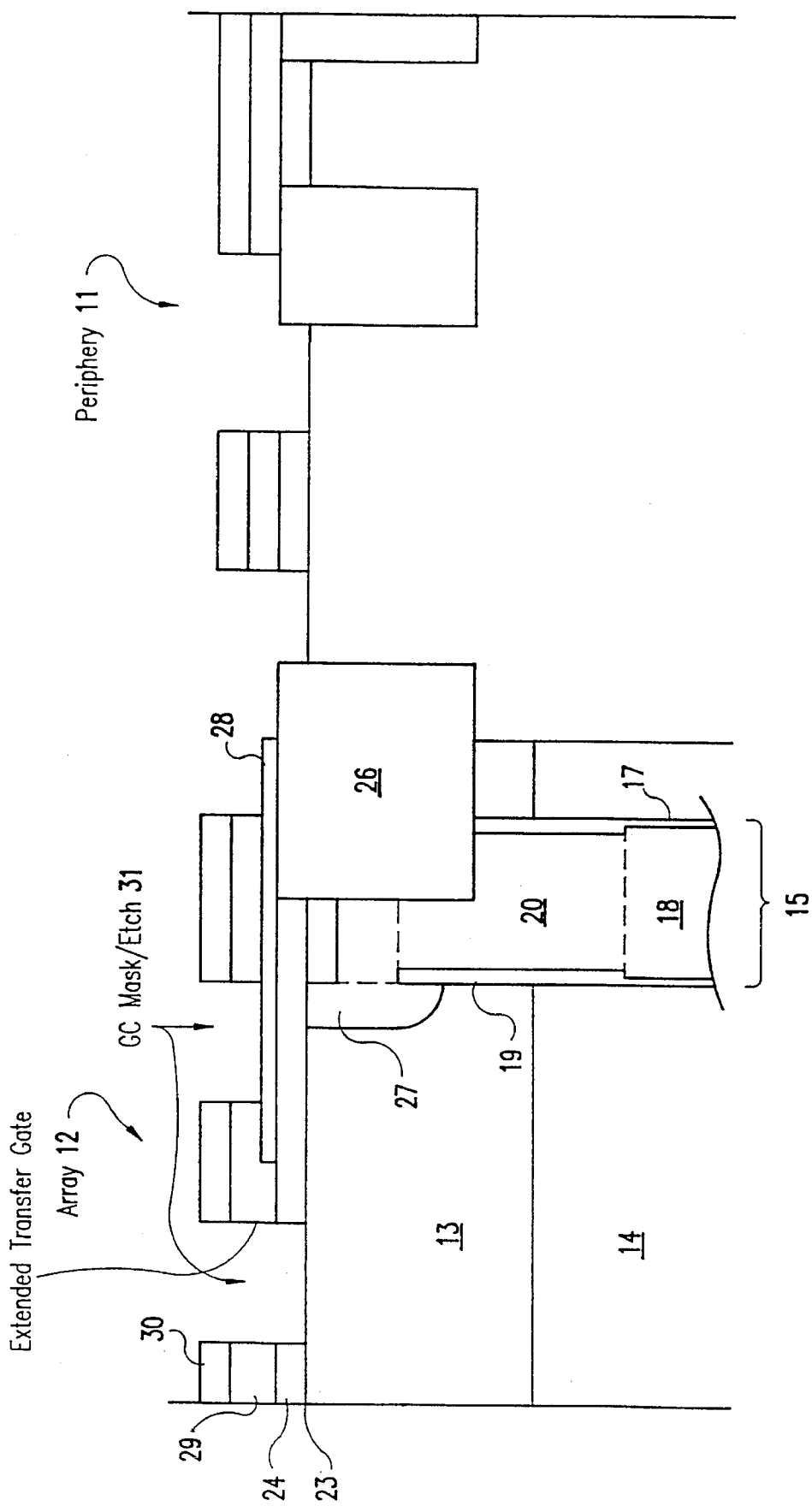
FIG. 8 is a cross section of a cell structure after gate conductor mask and etch.

In the seventh step shown in block 7 of FIG. 1, the gate conductor is etched using the GC mask. This is shown in FIG. 8. First, the gate conductor cap 30 is etched using the GC mask. The masking photoresist is then removed and the gate conductor 29 and gate polysilicon 24 are etched selectively to Si$_3$N$_4$ and SiO$_2$. In different areas of the structure, this etch stops on the gate cap 30, gate SiO$_2$ 23, thin insulator 28 or STI fill 26.

Figure 9:
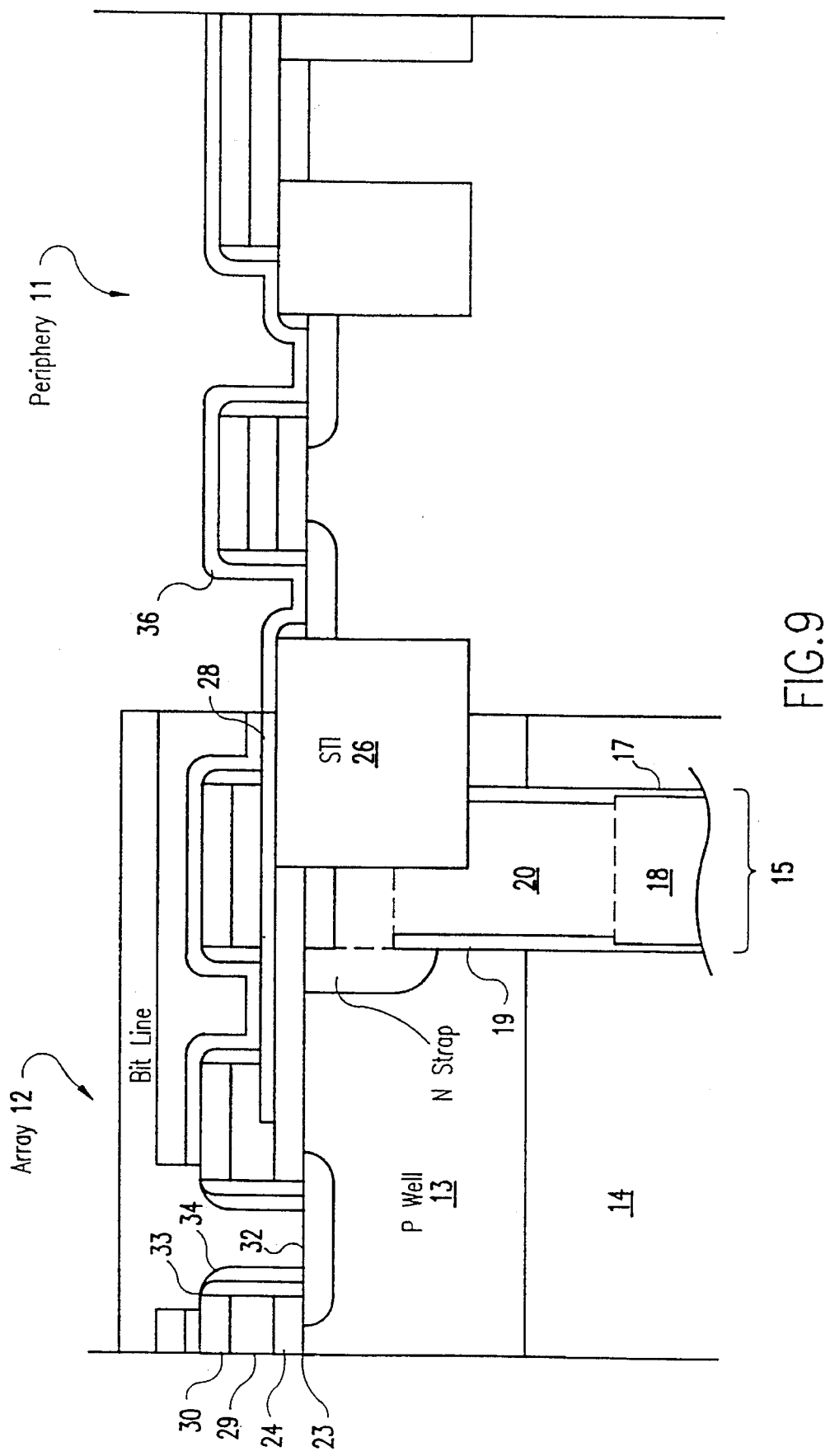
FIG. 9 is a cross section of a cell structure after spacers, junctions, passivation, contacts and wiring.

The final step shown in block 8, is to add spacers, junctions, passivation, and contacts. This is shown in FIG. 9. A spacer of SiO$_2$/Si$_3$N$_4$ 33 is built on the sidewall of the gate. Source/drain diffusions 32 are formed by implant/diffusion. A passivation/etch stop layer (Si$_3$N$_4$) 36 and first insulator (SiO$_2$) 35 are deposited. The bit line contact opening is etched through this first insulator 35, stopping on the passivation/etch stop layer 36. This passivation/etch stop layer is then etched, allowing contact to the bit line contact diffusion 32 and leaving an additional spacer 34 of the passivation/etch stop material on the gate sidewall in the bit line contact opening.

Figure 10:
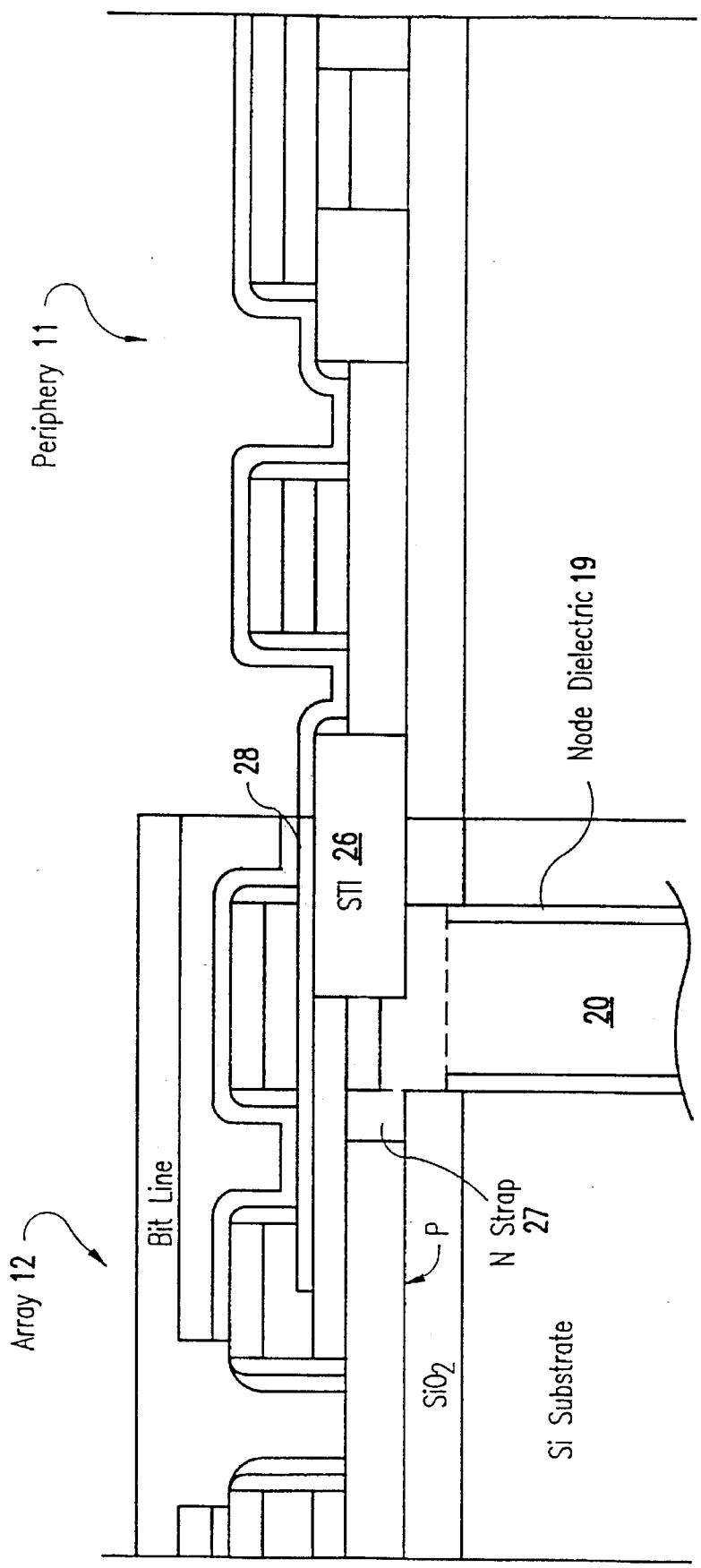
FIG. 10 is a cross section of a cell structure constructed according to an alternate embodiment of this invention.

A second embodiment of the invention is illustrated in FIG. 10. The sequence used to construct the cell shown in FIG. 9 is used here starting with a silicon on insulator (SOI) substrate. Use of an SOI substrate allows elimination of the DT collar and potential simplification of the plate, well and isolation processing. As can be seen in FIG. 10, the structure is similar to that of FIG. 9, except that the starting substrate is an SOI substrate. In this case, the bottom of the STI may be as shallow as the bottom surface of the device silicon layer, and the trench collar may be eliminated since the vertical parasitic field effect transistor (FET) on the sidewall of the trench has been eliminated.

Figure 11:
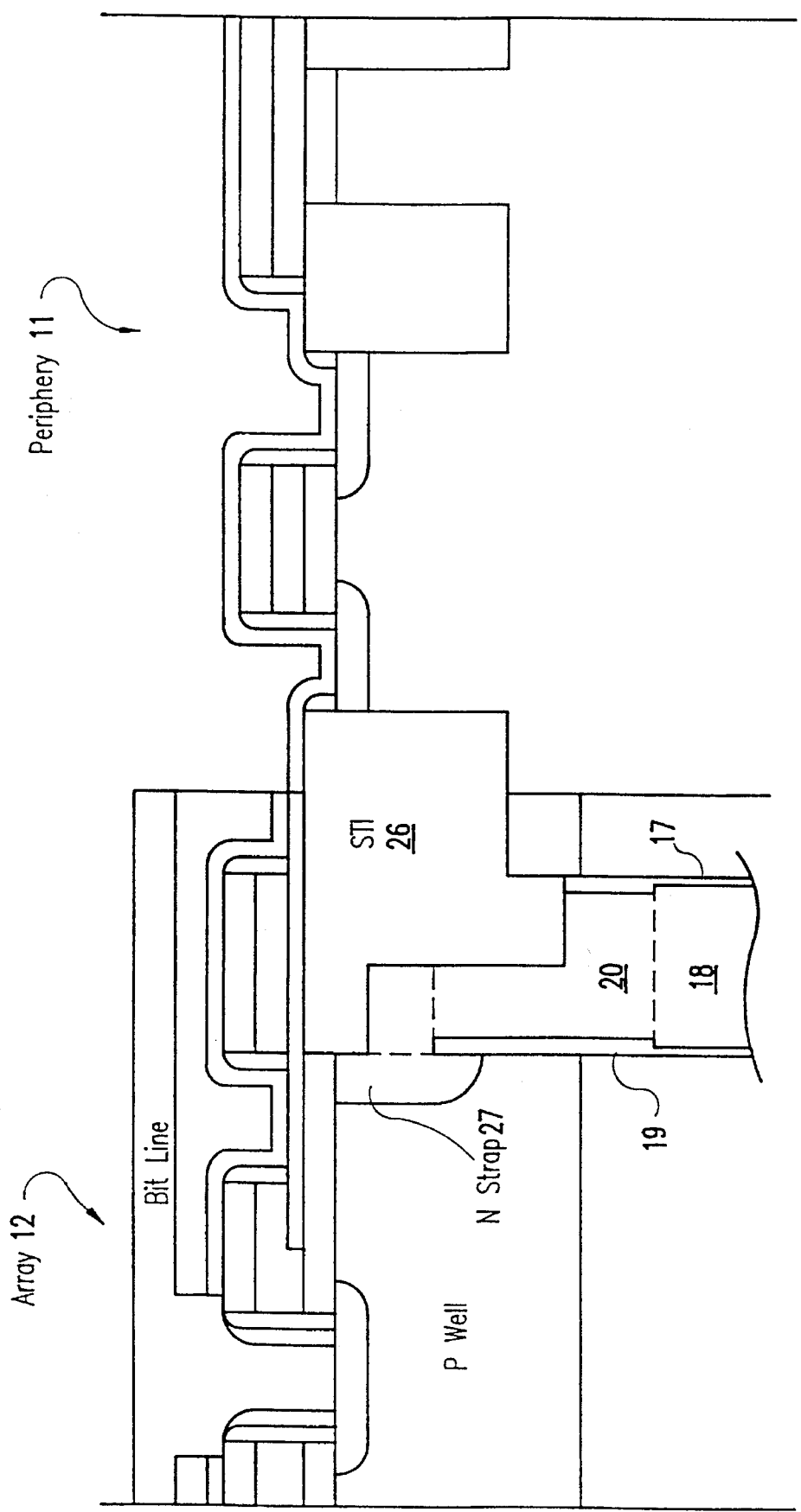
FIG. 11 is a cross section of a cell structure constructed according to second and third alternate embodiments of this invention.
Figure 12:
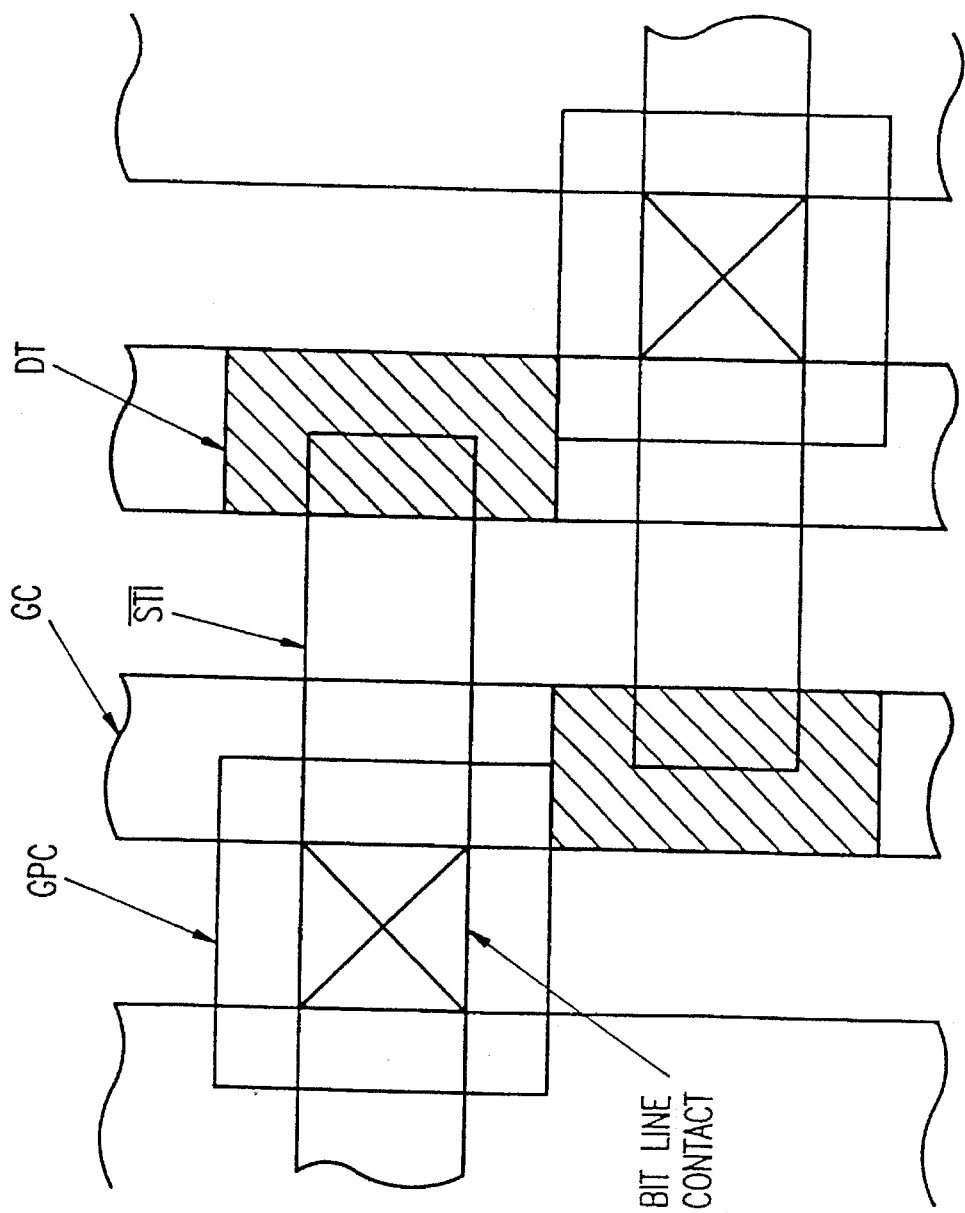
FIG. 12 is a cell layout according to an embodiment of this invention.

A third embodiment of invention is illustrated in FIG. 11. The process steps listed are rearranged such that SiO$_2$, gate polysilicon and pad are deposited first, followed by deep trench processing. Step 2, as shown in FIG. 1, is eliminated and the word line to word line capacitance decreases. After deep trench processing, the process steps proceed in the order shown in FIG. 1, steps 4 through 8. The gate deposition is placed prior to DT processing, which may not be desirable for other reasons (thermal budget). As can be seen in FIG. 11, the structure shown is similar to that of FIG. 9 except that the gate polysilicon does not overlap onto the trench. One result of this difference is that the overlap area between the gate polysilicon and the passing word line is reduced, reducing the word line to passing word line capacitance.

In a fourth embodiment, the process steps are again rearranged. The process steps start with deep trench processing as in step 1 of FIG. 1. Then the cell is etched with a shallow trench isolation mask and filled with SiO$_2$ as in the step 4 of FIG. 1, except the STI fill is planarized to a level significantly above the Si surface (100 nm for example, as little as 15 nm is possible), the gate SiO$_2$ and gate polysilicon are deposited and the gate polysilicon is planarized to the top of the STI (may require a planarization mask for the periphery). As can be understood from the previously described steps, the height to which the STI fill is planarized determines the height of the polysilicon. Then the process follows steps 5 through 8 of FIG. 1.

There are many advantages to a cell built by the methods of this invention. The cell prepared by a method of this invention allows a two lithographic feature transfer device channel length in an eight square folded bit line DRAM cell. The cell is manufactured using conventional, planar devices without sidewall imaging techniques. The method uses conventional processing techniques with no spacer defined features and uses conventional structures (e.g., no vertical devices). Conventional complementary metal oxide semiconductor (CMOS) structures are built in the peripheral region. The cell requires only one additional mask (GPC) and minimal additional processing.

The STI planarization pad is not in place when doing the second and third polysilicon recess etches within the DT, therefore the depth of the buried strap opening on the DT sidewall is more controllable. Also, this feature may allow a shallower STI depth. The STI is planarized to a level significantly above the Si surface, therefore the characteristics of the structure are less sensitive to STI planarization tolerances. The gate poly silicon no longer wraps around the STI-bound edges of the device, therefore the dependence of the device characteristics upon the depth of this wrap-around is eliminated. The STI bounded diffusion edge is no longer exposed following the STI fill, therefore better junction edge passivation is expected. The bit line contact (CB) etch stop Si$_3$N$_4$ no longer wraps down over the STI bounded junction edge; therefore, more CB over etch protection is expected. The node diffusion is formed only by the buried strap out diffusion and there is no junction implant into the node, therefore this cell has potentially better retention characteristics for two reasons: smaller node diffusion, no implant damage in the node diffusion.

While the invention has been described in terms of preferred embodiments, those skilled in the art will recognize that the invention can be practiced with modification within the spirit and scope of the appended claims.

Having thus described my invention, what I claim as new and desire to secure by Letters Patent is as follows:

1. A method of manufacturing a memory cell structure comprising the steps of:

providing a cell prepared with a trench, isolation regions and active area regions, wherein said active area regions are covered with gate SiO$_2$ and gate polysilicon;

depositing a thin insulator;

etching said insulator with a gate polysilicon contact mask to expose the gate polysilicon;

depositing a gate conductor and a gate conductor cap;

etching said gate conductor cap, gate conductor, and gate polysilicon stopping on said gate SiO$_2$ with a gate conductor mask; and adding spacers, junctions, passivation, contacts and wiring.

2. A method of manufacturing a memory cell structure as in claim 1 wherein said step of providing a cell for processing comprises:

depositing SiO$_2$, a gate polysilicon, and a pad on said cell; deep trench processing said cell;

etching using a shallow trench isolation mask; and depositing SiO$_2$ fill and planarizing.

3. A method of manufacturing a memory cell structure as in claim 1 wherein said step of providing a cell for processing comprises:

providing a cell which has been prepared with deep trench processing;

etching said cell with a shallow trench isolation mask;

depositing a SiO$_2$ fill;

planarizing said SiO$_2$ fill to a level which is a height of gate polysilicon;

depositing gate SiO$_2$ and gate polysilicon; and planarizing said gate polysilicon to said height.

4. A method of manufacturing a memory cell structure as in claim 1 wherein said step of providing a cell for processing comprises:

providing a cell which has been prepared with deep trench processing;

depositing a trench cap and planarizing;

depositing gate SiO$_2$ and gate polysilicon;

etching using a shallow trench isolation mask; and depositing SiO$_2$ fill and planarizing.

* * * * *